Feb. 6, 1968 P. L. RICHMAN 3,368,159

FEEDBACK SYSTEMS WITH OUTPUT INDUCTIVE DEVICES

Filed Oct. 29, 1964

Peter L. Richman
INVENTOR.

BY Michael P. Breston

ATTORNEY

United States Patent Office 3,368,159

Patented Feb. 6, 1968

3,368,159

FEEDBACK SYSTEMS WITH OUTPUT INDUCTIVE DEVICES

Peter L. Richman, Lexington, Mass., assignor, by mesne assignments, to Weston Instruments, Inc., Newark, N.J., a corporation of Delaware Filed Oct. 29, 1964, Ser. No. 407,449
10 Claims. (Cl. 330—103)

ABSTRACT OF THE DISCLOSURE

A feedback system includes an amplifier having two negative feedback circuits commonly coupled to the amplifier input. The output of the amplifier is A.C. coupled, for instance by a transformer, to one end of both feedback circuits and to a system output terminal that is coupled to the output winding of the transformer. One of the negative feedback circuits provides a first feedback current from the system output terminal to the amplifier input whereas the other negative feedback circuit provides a feedback current from the transformer input winding to the amplifier input. A third circuit is coupled to said other negative feedback circuit and includes at least one impedance that is scaled to at least one of the impedances which causes the A.C. coupling to exhibit less than ideal coupling characteristics. In those instances when a transformer is utilized as the A.C. coupling device, the additional circuit comprises a series resistance and inductance having values scaled to the lumped series resistance and inductance of the transformer so that the feedback current from said other negative feedback circuit exactly nullifies those components of feedback current that are generated by the lumped series resistance, inductance and capacitance of the transformer at resonant frequency.

Figures 1, 2, 3, 4:
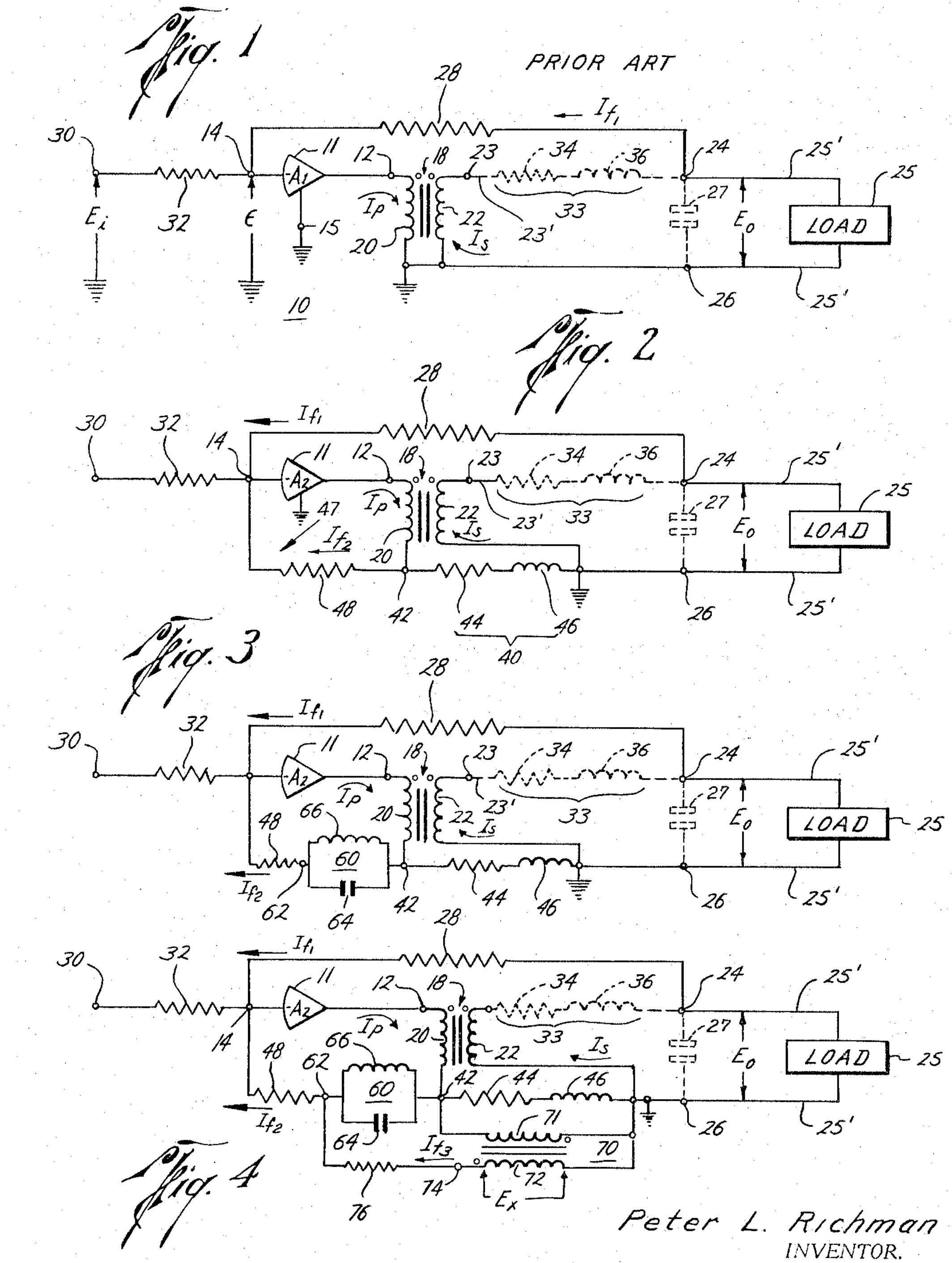
FIG. 1, FIG. 2, FIG. 3, FIG. 4 PRIOR ART

In accordance with another embodiment of this invention, a high-pass or band reject filter is utilized in the second negative feedback circuit to nullify said additional network at frequencies over which amplifier regulation is to be maintained as high as possible.

This invention relates to feedback systems and more particularly to feedback systems comprising high-fidelity, feedback amplifiers having inductive devices in their output stages.

In such systems, it is desired that the amplifier's gain be stable with time, that the amount of distortion (introduced by the amplifier and/or by the inductive device in its output stage) be at a minimum, and that the over-all system's gain be substantially independent of changes in the impedance connected to the system's output terminals.

The use of feedback circuits in and around amplifiers is well known in the art. However, when an inductive device, such as a transformer or an auto-transformer, is used in the output stage of the amplifier, certain undesirable distortions and instabilities may arise.

For convenience, let the term "load capacitor" designate the distributed capacitance of the transformer's windings, the capacitance of the load and/or of the cables connecting the load to the system's output terminals. Moreover, as is well known, inductive devices have "losses" (this term including all unwanted deviations from the ideal) which may, for convenience, be represented by a circuit comprising a resistor and an inductor, both connected in series with the load capacitor. It will be apparent that the series circuit constituted by the resistor, inductor, and capacitor will become a series resonant circuit at a frequency determined by the inductance L and capacitance C of the inductor and capacitor, respectively. The "Q" of this series resonant circuit is inversely proportional to the resistance in the resonant circuit. The higher the Q value, the higher the peak current will be at resonance.

Through the feedback path, the effect of the peak current flowing in the resonant circuit is transmitted to the input stage of the amplifier, thereby causing gain instability and/or oscillations. Even though in a practical system the series resonant conditions occur at frequencies well outside the operating frequency range, these resonant conditions have long prevented the use of significant amounts of feedback around such amplifiers: for example, the maximum tolerable amount of feedback has been on the order of 30 db or less. The limitation imposed on the maximum amount of feedback which may be employed around such amplifiers is most seriously felt in the construction of high-fidelity audio amplifiers and precision power amplifiers.

Accordingly, it is an object of this invention to provide new and improved feedback systems having amplifiers with inductive devices in their output stages from which the above-described and other deleterious effects caused by the resonant conditions are substantially completely eliminated.

It is another object of this invention to provide new and improved feedback amplifiers having inductive devices in their output stages in which significantly greater amounts of feedback may be employed than was heretofore possible thereby stabilizing the amplifiers' gain, greatly reducing their distortions, and improving their load regulation.

These and other objects are achieved, in accordance with this invention, by providing in an amplifier having an inductive device in its output stage, a main feedback path from the output of the amplifier to its input, and at least one auxiliary feedback path for applying to its input an auxiliary feedback current whose amplitude and phase are predetermined as a calculable function of the parameters of the inductive device in its output stage.

FIGURE 1 is a schematic circuit diagram of a typical prior art feedback amplifier having an inductive device in its output stage; and FIGURES 2–4 are schematic circuit diagrams of new and improved embodiments of this invention.

Referring to FIGURE 1 there is shown a typical prior art feedback system, generally designated as 10, having a phase inverting amplifier 11 of high gain minus $A_1$ connected between its output terminal 12 and input terminal 14. The input and output stages of the amplifier 10 have a common terminal 15 connected to a reference voltage level, such as ground 16. To the output of amplifier 11 is connected an inductive device such as a transformer 18 having a primary winding 20 and a secondary winding 22. The windings' polarities are indicated by the conventional dots. One end of the primary winding 20 is connected to terminal 12 and its other end is connected to ground. The lower end of the secondary winding 22 is also connected to ground and its upper end 23 is connected via a line 23' (and the network 33 representing the transformer imperfections) to an output terminal 24 for providing thereto an output voltage $E_0$. A load 25 is typically connected between output terminal 24 and another terminal 26 connected to ground. To improve the gain stability and the load regulation of the amplifier 11, a feedback resistor 28 is connected between output terminal 24 and the amplifier's input terminal 14. The input signal $E_1$ to be amplified is applied to the feedback system 10 at an input terminal 30. Terminal 30 is connected to terminal 14 via a resistor 32. Thus, terminal 14 becomes a summing junction which supports a vanishingly small potential epsilon $\epsilon$, as is well known.

Capacitor 27, shown connected between terminals 24 and 26, represents not only the load capacitance but the transformer's distributed capacitance and, if present, the capacitance of the cables 25' connecting the load 25 to the feedback system's output terminals 24, 26. This capacitor 27 has previously been referred to as the system's "load" capacitor. Also, let the losses and other imperfections of the transformer 18 be represented by a circuit 33 comprising a resistor 34 and an inductor 36, both connected in series between terminals 23 and 24.

It will be appreciated that at a frequency $F_o$ the series circuit 34, 36 and 27 will resonate, $F_o$ being a function of L and C. As is well known, at resonance the reactance $X_c$ of capacitor 27 is equal to the reactance $-X_L$ of inductor 36. Consequently the current $I_s$, flowing through the output terminals 24, 26 in a direction as shown by the arrow, will have at resonance a peak value primarily determined by the Q of the series resonant circuit, which includes the load 25. At resonance, the value of $I_s$ may increase by a factor of twenty or more from its normal value. Moreover, at resonance, the flow of $I_s$ between terminals 24 and 26 is accompanied by large phase shifts in the output voltage $E_o$. These phase shifts are reflected to the summing junction 14 via the feedback resistor 28 thereby causing instability.

Referring to FIGURE 2, where the same numerals are used to designate similar parts for the sake of simplicity, it will be noted that in accordance with this invention a sampling network 40 is connected in series with the primary winding 20 between a junction point 42 and ground. The sampling network 40 has an impedance $Z_s$ which, for convenience, is represented as a series circuit including a resistor 44 and an inductor 46. An auxiliary feedback path 47 including a resistor 48 connects junction 42 to the summing junction 14.

Let $Z_1$ represent the impedance of circuit 33, $I_p$ the current flowing in the primary winding 20, $I_s$ the current flowing in the secondary winding 22, $I_{f1}$ the main feedback current flowing from output terminal 24 to the summing junction 14, $I_{f2}$ the auxiliary feedback current flowing from junction 42 to the summing junction 14, and $n$ the transformer ratio, each of $Z_s$, $Z_1$, $I_p$, $I_s$, $I_{f1}$ and $I_{f2}$ being a vector, i.e., each having amplitude and phase. A simple analysis will show that the vector $I_{f1}$ is a function of $Z_1$ and that $I_{f2}$ is a function of $Z_s$. The value of $Z_s$ can be mathematically derived or experimentally determined so that the total feedback current $I_t=I_{f1}+I_{f2}$ is substantially independent of $Z_1$ and $Z_s$. More specifically, the values of the components forming the sampling circuit 40 may be obtained from the following equations:

$$R_{44}=\frac{1}{n}\frac{R_{48}}{R_{28}}R_{34} \quad \text{(Eq. 1)}$$

$$L_{46}=\frac{1}{n}\frac{R_{48}}{R_{28}}L_{36} \quad \text{(Eq. 2)}$$

Hence, by feeding back to the summing junction 14 an auxiliary feedback current $I_{f2}$ of predetermined amplitude and phase, the deleterious effects of the series resonant conditions, which may take place in the secondary circuit of transformer 18, are prevented from reaching the input stage of the amplifier 11. Because of the automatic cancellation of the components of $I_s$, which represent the series resonant conditions, at the summing junction 14, greater feedback can now be used around amplifier 11. Greater feedback can be achieved by increasing the gain of amplifier 11 to a value $-A_2$.

The circuit of FIGURE 2, while it is effective in eliminating at resonance, the undesirable components in the peak current $I_s$ from becoming reflected to the summing junction 14, does not improve the load regulation at the operating frequency range. The load regulation can be improved by disabling the effectiveness of the auxiliary feedback path 47 only at the operating frequency range, but maintaining its effectiveness at frequencies outside of the operating frequency range. This can be accomplished by inserting either a high-pass or a band reject filter 60 between junction 42 and resistor 48. The stopband of filter 60 is selected so that it will pass the auxiliary feedback current $I_{f2}$ only if its frequency is greater than the expected frequency of the input signal $E_i$. A simple embodiment of filter 60 may include a parallel circuit comprising a capacitor 64 and an inductor 66 connected between junctions 42 and 62.

At frequencies within the stopband of the filter 60 the impedance of the filter is high, while at high frequencies the impedance of the filter is low, thus enabling the feedback path to pass the cancelling resonant peaks it is designed to pass. Hence, by inserting the high-impedance network 60 in the path of the auxiliary feedback current $I_{f2}$ at the operating signal frequencies, the greater amount of feedback (which was made possible by using the sampling network 40) is fully utilized to the best advantage without hindering optimum load regulation by not impairing regulation at the operating frequency.

Better load regulation may still be achieved with the circuit shown in FIGURE 4 wherein a positive feedback path is provided. In FIGURE 4, an auxiliary feedback voltage $E_x$ is applied to the junction 62 via an auxiliary transformer 70 having a primary winding 71 and a secondary winding 72, the windings' polarities being indicated by the conventional dots. The primary winding 71 is connected between junction 42 and ground. The lower end of the secondary winding 72 is tied to ground, whereas the output terminal 74 of secondary winding 72 is coupled to junction 62 via a resistor 76. Secondary winding 72 feeds a current $I_{f3}$ to junction 62.

The operation of the embodiment shown in FIGURE 4 may be explained as follows: At the operating frequencies the impedance of filter 60 is very high and, hence, the auxiliary feedback current $I_{f2}$ is negligible. Suppose that when output terminals 24, 26 are open-circuited the output voltage has a value X and that when a particular load is connected to the output terminals the output voltage decreases by one volt. Then the value of the positive feedback voltage $E_x$ can be predetermined to compensate for the one volt drop caused by the load 25 and to restore the output voltage to its original value X. It will be apparent that at frequencies above the stopband of filter 60, the impedance of capacitor 64 is negligible and, hence, the feedback path coupling terminal 74 to terminal 62 is disabled. Consequently, with the embodiment shown in FIGURE 4 optimum load regulation can be achieved.

While particular embodiments of the present invention have been shown and described, it is apparent that changes and modifications may be made without departing from this invention in its broader aspects and, therefore, the aim in the appended claims is to cover all such changes and modifications as fall within the true spirit and scope of this invention.

I claim:

1. A feedback system comprising: an amplifier having an input and an output terminal, a transformer having a first winding and a second winding, said first winding being coupled to the amplifier output terminal, a system output terminal connected to one end of said second winding, sampling means connected to said first winding for sampling a current flowing therein which is representative of the current flowing in said second winding, first negative feedback means coupling said system output terminal to the amplifier input for providing to said amplifier input a first feedback current; second negative feedback means coupling said sampling means and said amplifier input for supplying to said amplifier input a second current representative of the current flowing in said second winding, said sampling means having an impedance which is a function of the resistance and inductance of said transformer and which is additionally, a function of the impedance of said first negative feedback means.

2. The system of claim 1 wherein said second feedback means includes a high-pass filter.

3. The system of claim 2 and further including another transformer coupled to said first transformer and to said second feedback means for supplying another feedback current to said input terminal.

4. A feedback system comprising a high-gain amplifier having an input terminal and an output terminal, a transformer having a primary winding that connects to a first junction and a secondary winding that connects to a system output terminal, said transformer including at least one impedance which causes said transformer to have less than ideal transformer characteristics, a grounded terminal, a sampling network for sampling the current flowing in said primary winding, means connecting said sampling network between said first junction and said grounded terminal, first feedback means coupled between said system output terminal and the amplifier input terminal, second feedback means coupling said first junction to said amplifier input terminal for supplying amplifier to said input terminal a feedback current that is indicative of the current flowing in said secondary winding, said sampling network having an impedance which is a function of said one impedance of said transformer and which is additionally a function of the impedance of said first feedback means.

5. The system of claim 4 wherein said second feedback means includes a high-pass filter.

6. The system of claim 5 and further including another transformer, means coupling said other transformer to said first junction and to said grounded terminal, and said other transformer supplying a regulating feedback current to said second feedback means.

7. A feedback system including an amplifier having an input terminal and an output terminal and a system output terminal to which a load may be connected, the system comprising, a first negative feedback circuit having two ends, one end of said first feedback circuit being connected to said system output terminal and the other end thereof being connected to the amplifier input terminal for feeding back to said amplifier a first time-varying current appearing at said system output terminal, A.C. coupling means including an input and an output, the input of said coupling means being coupled to the amplifier output terminal and the output of said coupling means being coupled to said system output terminal, a second negative feedback circuit connecting the coupling means input to said amplifier input terminal for feeding back to said amplifier a second time-varying current representative of the current flowing from the output of said coupling means, and a third circuit connected to the coupling means input and including at least one impedance scaled to at least one corresponding impedance parameter of said coupling means the presence of which causes said coupling means to have less than ideal A.C. coupling characteristics.

8. The system as claimed in claim 7, wherein said coupling means comprises a transformer which introduces at least resistive and inductive impedances into the system that are representable as lumped, series-connected impedances, and wherein said third circuit includes corresponding series-connected resistive and inductive impedances having respective values which are proportional to the values of the resistive and inductive transformer impedances.

9. The system as claimed in claim 8, wherein the relationships between said resistive and inductive impedances of said third circuit and the resistive and inductive impedances of said transformer are expressible by the equation:

$$R_i=\frac{1}{n}\left(\frac{R_{f_2}}{R_{f_1}}\right)R_T$$

$$L_i=\frac{1}{n}\left(\frac{R_{f_2}}{R_{f_1}}\right)L_T$$

wherein $R_i$ and $L_i$ are the respective resistive and inductive impedances of said third circuit;

$1/n$ is the transformer turns-ratio for potentials;

$R_{f1}$ and $R_{f2}$ are the respective resistive impedances of the first and second negative feedback circuits; and $R_T$ and $L_T$ are the respective lumped resistive and inductive impedances of said transformer.

10. The system as claimed in claim 7, wherein said second feedback circuit additionally includes a high-pass filter.

References Cited

UNITED STATES PATENTS 3,197,711 7/1965 Richardson ---------- 330—103

ROY LAKE, *Primary Examiner.*

E. C. FOLSOM, *Assistant Examiner.*

Disclaimer and Dedication 3,368,159.—*Peter L. Richman*, Lexington, Mass. FEEDBACK SYSTEMS WITH OUTPUT INDUCTIVE DEVICES. Patent dated Feb. 6, 1968. Disclaimer and dedication filed Mar. 17, 1971, by the assignee, *Weston Instruments, Inc.*

Hereby enters this disclaimer to the remaining term of said patent and dedicates said patent to the Public.

[*Official Gazette April 27, 1971.*]